United States Patent
Barale et al.

(10) Patent No.: US 8,406,371 B1
(45) Date of Patent: Mar. 26, 2013

(54) PROGRAMMABLE DIVIDER CIRCUITRY FOR IMPROVED DUTY CYCLE CONSISTENCY AND RELATED SYSTEMS AND METHODS

(75) Inventors: Francesco Barale, Austin, TX (US); Mustafa H. Koroglu, Austin, TX (US); Wenhuan Yu, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 13/343,392

(22) Filed: Jan. 4, 2012

(51) Int. Cl.
*H03K 21/00* (2006.01)
*H03K 23/00* (2006.01)

(52) U.S. Cl. .......................... 377/47; 377/48
(58) Field of Classification Search .................. None
See application file for complete search history.

(56) References Cited

U.S. PATENT DOCUMENTS

| | | | | |
|---|---|---|---|---|
| 4,906,875 | A * | 3/1990 | Cutler | 327/113 |
| 5,065,415 | A * | 11/1991 | Yamashita | 377/52 |
| 5,341,031 | A * | 8/1994 | Kinoshita et al. | 327/259 |
| 5,349,622 | A * | 9/1994 | Gorisse | 377/52 |
| 6,108,393 | A * | 8/2000 | Opsahl | 377/47 |
| 6,489,818 | B2 | 12/2002 | Vaucher et al. | 327/117 |
| 6,784,751 | B2 | 8/2004 | Salmi et al. | 331/16 |
| 6,822,491 | B1 * | 11/2004 | Glass | 327/115 |
| 6,842,054 | B2 * | 1/2005 | Wang | 327/115 |
| 6,970,025 | B2 * | 11/2005 | Magoon et al. | 327/115 |
| 7,042,257 | B2 * | 5/2006 | Wang | 327/115 |
| 7,109,762 | B2 * | 9/2006 | Neurauter et al. | 327/115 |
| 7,298,810 | B2 * | 11/2007 | Ke | 377/48 |
| 7,379,522 | B2 | 5/2008 | Narathong et al. | 377/47 |
| 7,587,019 | B2 * | 9/2009 | Yu et al. | 377/47 |
| 7,719,326 | B2 | 5/2010 | Casagrande et al. | 327/115 |
| 7,924,069 | B2 | 4/2011 | Narathong et al. | 327/117 |
| 2008/0186063 | A1 * | 8/2008 | Jewett | 327/117 |

OTHER PUBLICATIONS

Mark Ray et al., "*A 13GHz Low Power Multi-Modulus Divider Implemented in 0.13µm SiGe Technology*," Dept. of Electrical and Computer Engineering, Auburn University, Auburn, AL-36849-5201, USA, 2009.

Raja K. K. R. Sandireddy et al., "*A Generic Architecture for Multi-Modulus Dividers in Low-Power and High-Speed Frequency Synthesis*," Dept. of Electrical and Computer Engineering, Auburn University, Auburn, AL-36849-5201, USA; Topical Meeting on Silicon Monolithic Integrated Circuits in RF Systems, 2004.

Cicero S. Vaucher et al., "*A Family of Low-Power Truly Modular Programmable Dividers in Standard 0.35-µm CMOS Technology*," IEEE Journal of Solid-State Circuits, vol. 35, No. 7, Jul. 2000.

* cited by examiner

*Primary Examiner* — Tuan T Lam
(74) *Attorney, Agent, or Firm* — O'Keefe, Egan, Peterman & Enders LLP

(57) ABSTRACT

Programmable divider circuitry is disclosed that utilizes two cascaded divider cells to generate division ratios from 4 to 7 and utilizes an output signal from one of the divider cells to sample and synchronize the divider output signal. The operation of the programmable divider circuitry improves the consistency of duty cycles generated across the different division ratios. Further techniques are also applied to make more consistent the duty cycles depending upon the division ratio selected.

20 Claims, 6 Drawing Sheets

US 8,406,371 B1

PROGRAMMABLE DIVIDER CIRCUITRY FOR IMPROVED DUTY CYCLE CONSISTENCY AND RELATED SYSTEMS AND METHODS

TECHNICAL FIELD OF THE INVENTION

This invention relates to divider circuitry for generating divided clock signals and, more particularly, to divider circuitry for radio frequency (RF) receivers.

BACKGROUND

It is often desirable to generate signals at lower frequencies or speeds than an input signal. Divider circuitry is often used to receive an input signal and to provide a divided version of this input signal. The divided version of the input signal is at a lower frequency or rate than the input signal. For example, it may be desirable to generate one or more slower clock signals from a faster input clock signal. For example, if a 500 MHz clock signal were desired from a 3.0 GHz clock input signal, divider circuitry that divides this input clock signal by six (divide-by-6) could be used to achieve the desired output clock signal.

Further, it is often desirable to have the divider circuitry be programmable to allow different divided output signals to be generated. For example, with respect to many radio frequency (RF) receivers, there is a need to tune to different broadcast channels. This tuning is often accomplished using mixer circuitry to down-convert desired channels within the incoming RF signals to a lower intermediate frequency (IF) prior to further processing. This conversion of a desired channel with a particular center frequency ($f_C$) can be achieved by mixing the incoming RF signal spectrum with a mixing signal that is offset in frequency from the center frequency ($f_C$) by the desired IF. This mixing signal is typically based upon an oscillation signal generated by local oscillator (LO) circuitry. If the oscillation output signal begins at a higher frequency, programmable divider circuitry can be used to reduce the frequency of the oscillation signal to the desired frequency for the mixing signal.

FIG. 1A (Prior Art) is a block diagram for prior programmable divider circuitry 100. This divider circuitry utilizes a plurality of N cascaded divider cells (DIV 2/3) 102A, 102B ... 102C, 102D. Each of these divider cells 102A, 102B ... 102C, 102D provide either a divide-by-2 mode or a divide-by-3 mode of operation based upon a programmable input signal 114A, 114B ... 114C, 114D received at the programming port ($p_i$) for each cell and based upon a modulus input signal ($mod_{IN}$) received from the adjacent divider cell. Each of these divider cells 102A, 102B ... 102C, 102D is configured to receive an input signal ($F_{IN}$), to receive a modulus input signal ($mod_{IN}$), to generate an output signal ($F_{OUT}$), and to generate a modulus output signal ($mod_{OUT}$). And these cascaded divider cells 102A, 102B ... 102C, 102D are connected together.

More particularly, for the embodiment depicted, divider cell 102A (#1) receives the overall input signal (IN) 104 as its input signal ($F_{IN}$), receives a programming signal ($p_0$) 114A as its programming signal ($p_i$), receives a modulus signal ($mod_1$) 110A from divider cell 102B as its modulus input signal ($mod_{IN}$), and outputs a divided frequency signal ($F_{O1}$) 106A as its output signal ($F_{OUT}$). Divider cell 102B (#2) receives the divided frequency signal ($F_{O1}$) 106A as its input signal ($F_{IN}$), receives a programming signal ($p_1$) 114B as its programming signal ($p_i$), receives a modulus signal ($mod_2$) 110B from the next divider cell (not shown) as its modulus input signal ($mod_{IN}$), outputs a divided frequency signal ($F_{O2}$) 106B as its output signal ($F_{OUT}$), and outputs a modulus output signal ($mod_1$) 110A as its modulus output signal ($mod_{OUT}$). Divider cell 102C (#3) receives a divided frequency signal from the previous divider cell (not shown) as its input signal ($F_{IN}$), receives a programming signal ($p_{N-2}$) 114C as its programming signal ($p_i$), receives a modulus signal ($mod_{N-1}$) 110C from divider cell 102D as its modulus input signal ($mod_{IN}$), outputs a divided frequency signal ($F_{ON-1}$) 106C as its output signal ($F_{OUT}$), and outputs a modulus output signal as its modulus output signal ($mod_{OUT}$). Divider cell 102D (#4) receives a divided frequency signal ($F_{ON-1}$) 106C from divider cell 102C as its input signal ($F_{IN}$), receives a programming signal ($p_{N-1}$) 114D as its programming signal ($p_i$), receives a fixed signal 110D (e.g., logic high level "1") as its modulus input signal ($mod_{IN}$), outputs a divided frequency signal ($F_{oN}$) 106D as its output signal ($F_{OUT}$), and outputs a modulus output signal ($mod_{N-1}$) 110C as its modulus output signal ($mod_{OUT}$). It is noted that the modulus output signal for the first divider cell 102A is not used in the embodiment depicted.

The divider output signal (OUT) 112 for the divider circuitry 100 is taken from the modulus output signal ($mod_i$) 110A generated by divider cell 102B. The operation of this divider circuitry 100 produces a signal that is delayed in time (i.e., divided in frequency) according to the following equation:

$$T_{OUT} = [2^N + (2^{N-1})p_{N-1} + (2^{N-2})p_{N-2} + \ldots + (2)p_1 + p_0] T_{IN},$$

where $T_{IN}$ represents the clock period for the input signal (IN) 104, $T_{OUT}$ represents the clock period for the output signal (OUT) 112, N is the number of cascaded divider cells, and $p_0$, $p_1 \ldots, p_{N-2}, p_{N-1}$ represent the programming signals for the cascaded divider cells. Thus, as is seen by this equation for $T_{OUT}$, the available division ratios are determined by the number of cells (N), with the minimum division ratio being $2^N$ and the maximum division ratio being $2^{N+1}-1$. For example, where N=2, the equation for the output clock cycle time ($T_{OUT}$) to the input clock cycle time ($T_{IN}$) is represented by $T_{OUT} = [4+2p_1+p_0]T_{IN}$, and the available division ratios are 4, 5, 6 and 7. With respect to the programming signal ($p_1p_0$), a divide-by-4 is selected with $p_1p_0$=00; a divide-by-5 is selected with $p_1p_0$=01; a divide-by-6 is selected with $p_1p_0$=10; and a divide-by-7 is selected with $p_1p_0$=11.

In operation, if the programming input signal for a divider cell is a logic low or "0," then that divider cell will always operate in a divide-by-2 mode. If the programming signal for a divider cell is a logic high or "1," then that divider cell will operate in a divide-by-2 mode when its modulus input signal is a logic low or "0," or it will operate in a divide-by-3 mode when its modulus input signal is a logic high or "1." Because the final divider cell 102D has its modulus input ($mod_{IN}$) tied to a fixed logic high signal ("1") 110D, the final divider cell 102D will always operate in a divide-by-3 mode when its programming input signal ($p_i$) is a logic high or "1."

Where N=2, for example, a divide-by-4 or a divide-by-5 will be provided when $p_1$=0, and a divide-by-6 or a divide-by-7 will be provided when $p_1$=1. For divide-by-4 and divide-by-5 modes of operation, the second divider cell 206B will divide by two in both modes. And in the divide-by-5 mode, the first divider cell 206A will swallow one extra input cycle for each output period of the second divider cell 206B (i.e., the output will be longer by one extra input cycle). For divide-by-6 and divide-by-7 modes of operation, the second divider cell 206B will divide by three in both modes. And in the divide-by-7 mode, the first divider cell 206A will swallow one extra input cycle for each output period of the second divider cell 206B (i.e., the output will be longer by one extra input cycle).

FIG. 1B (Prior Art) is a circuit diagram of an embodiment for programmable divider cell circuitry (DIV 2/3) 150 that can be used for divider cells 102A, 102B . . . 102C, 102D in FIG. 1A. Divider cell circuitry 150 receives an input signal 162 having an input frequency ($F_{IN}$). Divider cell circuitry 150 also generates an output signal 164 having an output frequency ($F_O$). The divider cell circuitry 150 also receives an input modulus signal ($mod_{IN}$) 184 and generates an output modulus signal ($mod_{OUT}$) 182. The circuitry with the divider cell circuitry 150 is organized as prescaler logic 160 and end-of-cycle logic 180. The prescaler logic 160 includes an AND gate 166, a D flip-flop latch (Dlatch 1) 168 and a D flip-flop latch (Dlatch 2) 170. The end-of-cycle logic 180 includes an AND gate 192, an AND gate 188, a D flip-flop latch (Dlatch 3) 186 and a D flip-flop latch (Dlatch 4) 170.

Looking in more detail to the prescaler logic 160, the AND gate 166 receives the output signal 164 and divider selection signal (2/3) 165 from the end-of-cycle logic 180 that determines whether the divider circuitry 2/3 is dividing by two or by three. The D flip-flop latch 168 receives the output of AND gate 166 as its data (D) input and receives the input signal 165 as its clock (CLK) input. The output (Q) of the D flip-flop latch 168 is received as the data (D) input for the D flip-flop latch 170. The D flip-flop latch 170 also receives an inverted version of the input signal 162 as its clock (CLK) input. The inverted output (Q_bar) of D flip-flop latch 170 is provided as the output signal 164, and the non-inverted output (Q) is provided to AND gate 192 within the end-of-cycle logic 180. It is noted that "Q_bar" as used herein represents the Q-overscore symbol within the drawings, which is the inverted version of the Q output signal. It is also noted that the open circle in front of inputs within the drawings, such as the clock (CLK) input for D flip-flop latch 170, indicates that an inverted version of the connected signal is being received.

Looking in more detail to the end-of-cycle logic 180, the AND gate 192 receives the non-inverted output (Q) from D flip-flop latch 170 and also receives the modulus input ($mod_{IN}$) 184. The output of AND gate 192 is received as the data (D) input for D flip-flop latch 190. The D flip-flop latch 190 also receives the input signal 162 as its clock (CLK) input and provides the modulus output signal ($mod_{OUT}$) 182 as its non-inverted output signal (Q). This non-inverted output signal (Q) from D flip-flop latch 190 is received as an input to AND gate 188 along with the programming input signal ($p_i$) 152. The output of AND gate 188 is provided as the data (D) input for D flip-flop latch 186. D flip-flop latch 186 also receives an inverted version of the input signal 162 as its clock (CLK) input. The inverted output signal (Q_bar) from D flip-flop latch 186 provides the divider selection signal (2/3) 165.

It is noted that the D flip-flop latches operate such that the signal logic level presented at the data input (D) at each rising clock edge on the clock input (CLK) is provided as the output (Q) for the D flip-flop latch. In other words, the D flip-flop latches operate such that the signal logic level presented at the data input (D) is transparent to the output (Q) when the clock input (CLK) level is high. When the clock input (CLK) level is low, the output value (Q) is held, and it is insensitive to the input (D). Further, the operation of the divider circuitry shown in FIGS. 1A and 1B is further described in the following article: Vaucher, *A Family of Low-Power Truly Modular Programmable Dividers in Standard 0.35-μm CMOS Technology*, IEEE JSSC, Vol. 35, No. 7, pages 1039-1045 (July 2000), which is hereby incorporated by reference in its entirety.

Although the cascaded divide-by-2/3 (DIV 2/3) cells described in FIGS. 1A-1B provide a useful solution for programmable divider circuitry that provides integer division ratios from $2^N$ to $2^{N+1}-1$, problems can arise due to the duty cycles generated by this divider circuitry. For example, where N=2 and division ratios 4, 5, 6 and 7 are selectable, the clock cycles for divide-by-4 are $2T_{IN}$ high and $2T_{IN}$ low or about 50% duty cycle. The clock cycles for divide-by-5 are $2T_{IN}$ high and $3T_{IN}$ low or about 40% duty cycle. The clock cycles for divide-by-6 are $2T_{IN}$ high and $4T_{IN}$ low or about 33% duty cycle. And the clock cycles for divide-by-7 are $2T_{IN}$ high and $5T_{IN}$ low or about 29% duty cycle. These differences in duty cycles, for example, can introduce undesirable errors for particular solutions that use this divider circuitry.

SUMMARY OF THE INVENTION

Programmable divider circuitry is disclosed that utilizes two cascaded divider cells to generate division ratios from 4 to 7 and utilizes an output signal from one of the divider cells to sample and synchronize the divider output signal. The operation of the programmable divider circuitry improves the consistency of duty cycles generated across the different division ratios. Further techniques are also applied to make more consistent the duty cycles depending upon the division ratio selected. As described below, other features and variations can be implemented, if desired, and a related systems and methods can be utilized, as well.

DESCRIPTION OF THE DRAWINGS

It is noted that the appended drawings illustrate only exemplary embodiments of the invention and are, therefore, not to be considered limiting of its scope, for the invention may admit to other equally effective embodiments.

DETAILED DESCRIPTION OF THE INVENTION

Programmable divider circuitry is disclosed that utilizes two cascaded divider cells to generate division ratios from 4 to 7 and utilizes an output signal from one of the divider cells to sample and synchronize the divider output signal. The operation of the programmable divider circuitry improves the consistency of duty cycles generated across the different division ratios. Further techniques are also applied to make more consistent the duty cycles depending upon the division ratio selected.

Figure 2A:
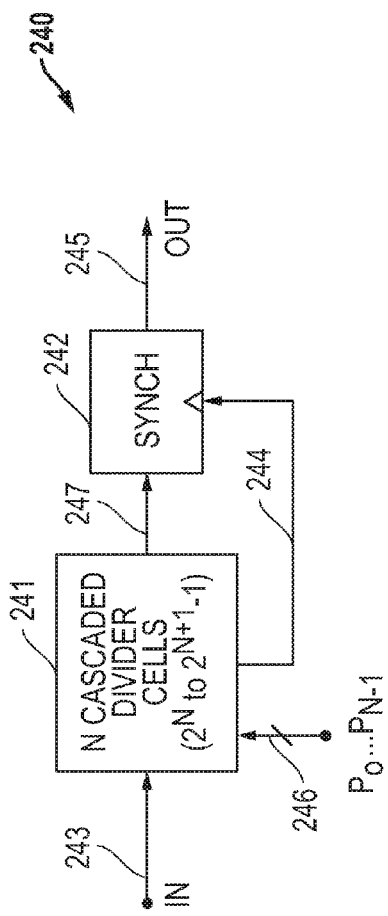
FIG. 2A is a block diagram for programmable divider circuitry that utilizes an output signal from one of the divider cells to sample and synchronize the divider output signals.

With respect to the drawings, a general block diagram is provided in FIG. 2A. Next, more detailed diagrams are provided with respect to FIGS. 2B-2D for embodiments where the number of divider cells is two (N=2). And FIGS. 3A-3D then provide timing diagrams for each division ratio of 4, 5, 6 and 7 for the embodiments of FIGS. 2B-2D.

Looking first to FIG. 2A, a general block diagram is provided of an embodiment 240 for programmable divider circuitry that utilizes at least one signal generated by a plurality of cascaded divider cells to sample and synchronize a divider output signal. As depicted, a plurality of N cascaded divider cells 241 is configured to receive an input signal (IN) 243 and to apply a selectable integer division ratio from a minimum division ratio of $2^N$ to a maximum division ratio of $2^{N+1}-1$, where N is the number of cascaded divider cells. The cascaded divider cells 241 also receive programming input signals 246 ($p_0 \ldots p_{N-1}$) that determine in part the operation of each divider cell. The divider output signal 247 from the cascaded divider cells 241 is then provided to synchronization circuitry 242. Synchronization circuitry 242 is configured to use an output signal 244 generated by one of the divider cells as a synchronization signal to sample and synchronize the divider output signal 247. The synchronization circuitry 242 then outputs the synchronized divider output signal 245 that can be utilized by other circuitry.

The programmable divider circuitry 240 advantageously achieves improved duty cycle consistency across the different divider ratios provided by the programmable divider circuitry. This improved duty cycle allows for enhanced performance and can be particularly useful for generating mixing signals for receiving RF signals based upon divided versions of high frequency oscillation signals. In part, this improved duty cycle consistency is achieved by using the output signal 244 from a divider cell within the plurality of cascaded divider cells 241 to synchronize the divider output signal 247. It is noted that each of the cascaded divider cells can be implemented using the circuitry of FIG. 1B (Prior Art) or similar circuitry if desired.

Figure 2B:
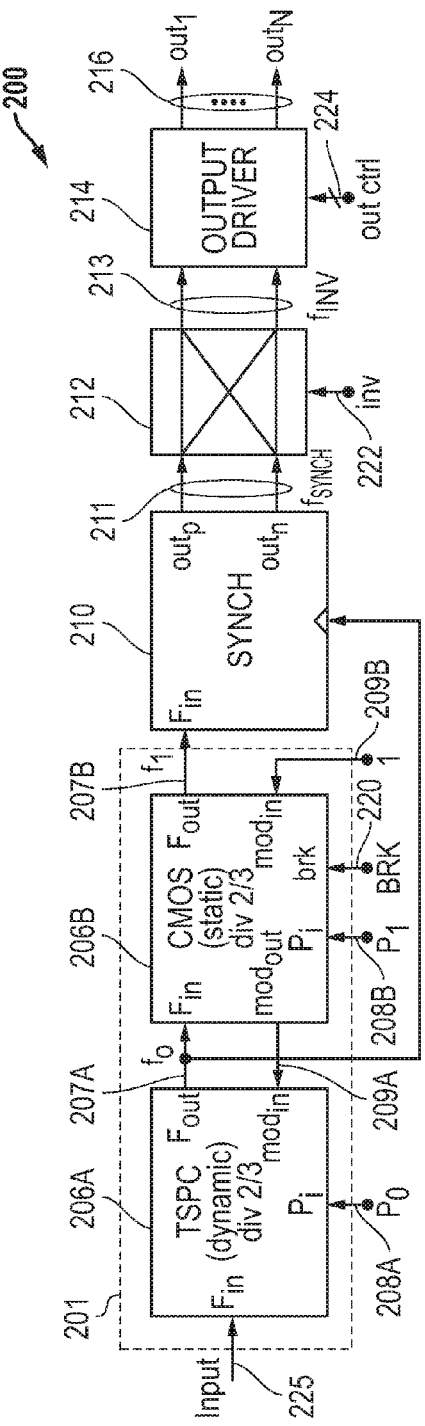
FIG. 2B is a block diagram for programmable divider circuitry that utilizes an output signal from one of the divider cells to sample and synchronize the divider output signals where N=2 and divider ratios of 4, 5, 6 and 7 are provided.

FIG. 2B is a more detailed diagram of an embodiment 200 for programmable divider circuitry having improved duty cycle consistency across different divider ratios for embodiments that use two divider cells (N=2). In part, this improved duty cycle consistency is achieved by using synchronization circuitry 210 and the output signal ($f_0$) 207A from divider cell 206A to synchronize the divider output signal ($f_1$) 207B for the cascaded divider cells 201. The duty cycle consistency can be further improved by adjusting the divider cells and/or their output signals for the divide-by-6 and divide-by-7 programming selections, as described below.

For the embodiment 200 depicted, two divider cells 206A and 206B are used for the plurality of cascaded divider cells 201. If desired, the circuitry for these divider cells 206A and 206B can be implemented using circuitry described with respect to FIGS. 1A-1B (Prior Art) above or similar circuitry. However, unlike the circuitry of FIGS. 1A-1B (Prior Art), the divider output signal for the cascaded divider cells 201 is the frequency output signal ($f_1$) 207B from the second divider cell (DIV 2/3) 206B rather than the modulus output signal ($mod_{OUT}$) 207A from the second divider cell 206B. Also, unlike the circuitry of FIGS. 1A-1B (Prior Art), the divider output signal ($f_1$) 207B is provided to synchronization circuitry 210, where the divider output signal is sampled and synchronized by the output signal ($f_0$) 207A from the first divider cell (DIV 2/3) 206A to produce a synchronized divider output signal ($f_{SYNCH}$) 211. If desired, this synchronization circuitry 210 can also convert a singled-ended input signal 207B to a double-ended differential output signal 211.

It is noted that the synchronization circuitry 210 can be implemented as a D flip-flop, and the single-ended to differential conversion can be implemented using a pseudo-differential architecture for two internal latches.

As described in more detail below, inversion circuitry 212 can also be used, if desired, to improve the consistency of duty cycles across different division ratios. As depicted, the differential output signal 211 is received by the inversion circuitry 212, and the differential output signal ($f_{INV}$) 213 from the inversion circuitry 212 is provided to output driver circuitry 214.

Looking now in more detail to the plurality of cascaded divider cells 201, the first programmable divider cell (DIV 2/3) 206A receives an overall input signal (INPUT) 225 as its input signal ($f_{IN}$), receives a programming signal ($p_0$) 208A as its programming input signal ($p_i$), and a signal 209A from the second divider cell 206B as its modulus input signal ($mod_{IN}$). The first programmable divider cell (DIV 2/3) 206A also provides signal ($f_0$) 207A as its output signal ($F_{OUT}$), which is in turn received as the input signal ($F_{IN}$) of the second programmable divider cell (DIV 2/3) 206B. The second programmable divider cell (DIV 2/3) 206B also receives a programming signal ($p_1$) 208B as its divider programming input signal ($p_i$) and receives a logic "1" signal 209B as its modulus input signal ($mod_{IN}$). Further, the second programmable divider cell (DIV 2/3) 206B provides signal ($f_1$) 207B as its output signal ($F_{OUT}$), which is in turn provided as the divider output signal to the synchronization circuitry 210. The programmable inputs ($p_o$, $p_1$) 208A and 208B determine at least in part the division ratio for the divider circuitry 200, and the available division ratios are 4, 5, 6 and 7.

Figure 1A:
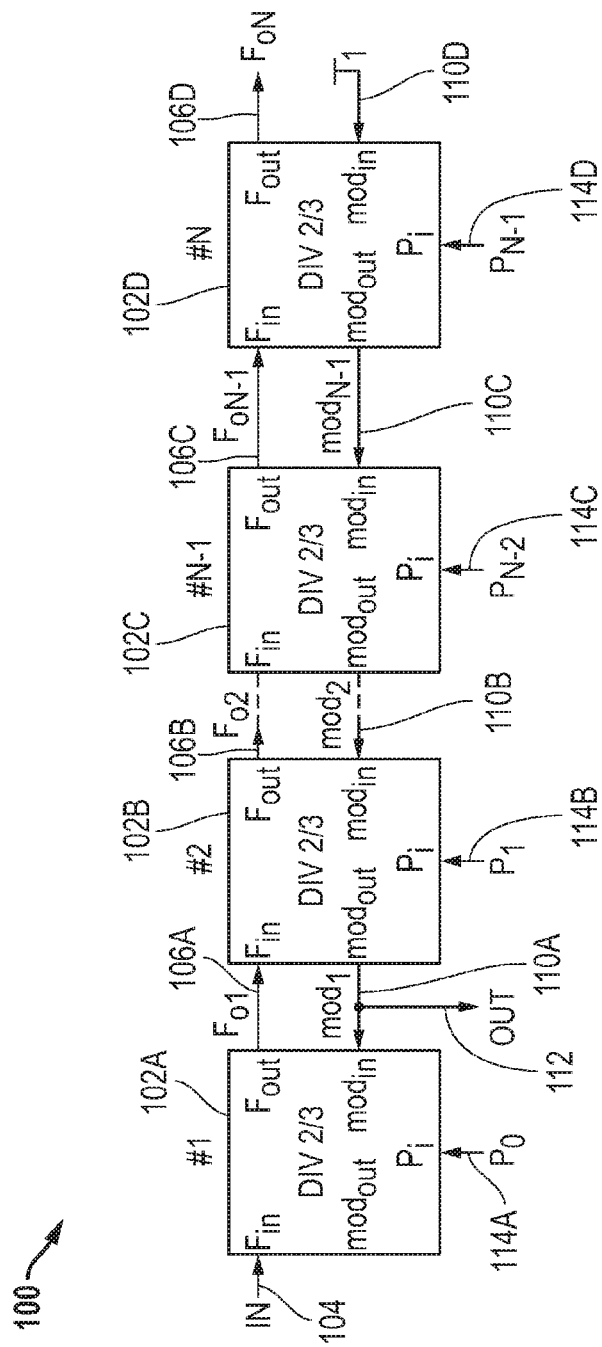
FIG. 1A (Prior Art) is a block diagram for divider circuitry using cascaded divider cells according to a prior solution.

Similar to FIG. 1A (Prior Art), divide-by-4 mode is selected for embodiment 200 by setting the programming signals to $p_1p_0$=00; divide-by-5 mode is selected by setting the programming signals to $p_1p_0$=01; and divide-by-7 mode is selected by setting the programming signals to $p_1p_0$=11. However, as described further below, divide-by-6 is selected by setting the programming signals to $p_1p_0$=01, rather than to $p_1p_0$=10 as used by FIGS. 1A-1B (Prior Art), along with a change to force the first divider cell 206A to always be a divide-by-3 and the second divider cell 206B to always be a divide-by-2, using the adjustment signal (BRK) 220 applied to the BRK input of the second divider cell 206B. Further, for divide-by-7 mode, the synchronized divider output signal ($f_{SYNCH}$) 211 is inverted to further improve consistency of duty cycles across the programmable division ratios, using the inversion control signal (INV) 222 applied to inversion circuitry 212.

As described in more detail below, the operation of the programmable divider circuitry 200 produces a duty cycle of about 50% for divide-by-4 mode, about 40% for divide-by-5 mode, about 50% for divide-by-6 mode, and about 43% for divide-by-7 mode. The following TABLE shows a comparison between the embodiment 200 of FIG. 2B and an embodiment using the prior art solution of FIG. 1A where N=2.

TABLE

Improvement of Duty Cycle Consistency

| Prior Solution (FIGS. 1A-1B) | | | Improved Solution (FIGS. 2A-2D, 3A-3D) | | |
| --- | --- | --- | --- | --- | --- |
| Division Ratio | $p_1p_0$ (N = 2) | Duty Cycle | Division Ratio | $p_1p_0$ (N = 2) | Duty Cycle |
| 4 | 00 | 50% | 4 | 00 | 50% |
| 5 | 01 | 40% | 5 | 01 | 40% |

TABLE-continued

Improvement of Duty Cycle Consistency

| Prior Solution (FIGS. 1A-1B) | | | Improved Solution (FIGS. 2A-2D, 3A-3D) | | |
| --- | --- | --- | --- | --- | --- |
| Division Ratio | $p_1 p_0$ (N = 2) | Duty Cycle | Division Ratio | $p_1 p_0$ (N = 2) | Duty Cycle |
| 6 | 10 | 33% | 6 | 01 (BRK) | 50% |
| 7 | 11 | 29% | 7 | 11 (INV) | 43% |

Advantageously, the duty cycles achieved by the improved solution described herein are more consistent that the duty cycles achieved by the prior solution. In particular, the duty cycle for the division ratio of 6 is 50% rather than 33%, and the division ratio for the division ratio of 7 is 43% rather than 29%.

Figure 1B:
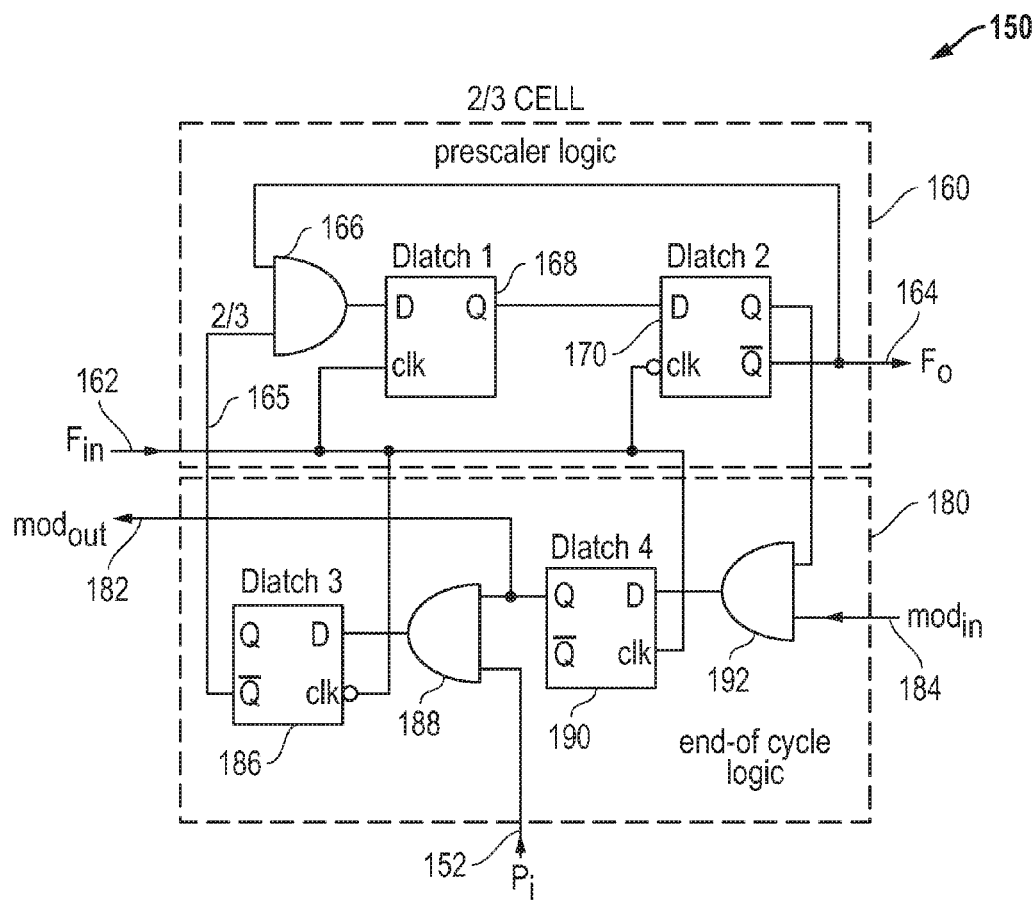
FIG. 1B (Prior Art) is a circuit diagram for divider cell circuitry that can be used for the cascaded divider cells of FIG. 1A (Prior Art).

To achieve the 50% duty cycle for the divide-by-6 selection, as opposed to the 33% duty cycle for the prior art solution in FIGS. 1A-1B (Prior Art), the cascaded divider cells 201 are adjusted using the adjustment signal (BRK) 220 so that the first divider cell 206A operates always as a divide-by-3. In particular, the second divider cell 206B is configured to provide a fixed logic high or "1" on its modulus output signal ($mod_{OUT}$) 209A so long as the adjustment signal (BRK) 220 is asserted. And the adjustment signal is asserted (e.g., a logic low is applied on the BRK signal 220) when a divide-by-6 operation is desired. The programmable inputs ($p_1 p_0$) 208A and 208B are then set such that $p_1=0$ and $p_0=1$, which is in contrast to the $p_1 p_0=10$ used by FIGS. 1A-1B (Prior Art) for a divide-by-6 with N=2. With this modification using the adjustment signal (BRK) 220, the first divider cell always operates as a divide-by-3, and the second divider cell 206B always operates as a divide-by-2, thereby achieving a divide-by-6 mode with an output signal having a 50% duty cycle. It is noted that adjustment signal (BRK) 220 could be adjusted such that a high logic level indicates assertion of this signal. It is also noted that the adjustment signal (BRK) 220 could also be applied to the first divider cell 206A, if desired, to adjust its circuitry to always have a fixed logic high or "1" as its modulus output signal ($mod_{IN}$). Further modifications could also be made if desired.

To achieve the 43% duty cycle for the divide-by-7 selection, as opposed to the 29% duty cycle for the prior art solution in FIGS. 1A-1B (Prior Art), the output of the cascaded divider cells 201 are sampled and synchronized using the output signal ($f_O$) 207A from the first divider cell 206A. This operation results in a 57% duty cycle output, as described in more detail below with respect to FIG. 3D. In addition, for divide-by-7, the divider output signal is also inverted using the inversion circuitry 212, which is controlled by the inversion control signal (INV) 222. If the inversion control signal (INV) 222 is not asserted (e.g., set to a low logic level), the inversion circuitry 212 simply provides the differential signal 211 to the output driver 214 as differential signal 213. If the inversion control signal (INV) 222 is asserted (e.g., set to a high logic level), the inversion circuitry 212 switches the differential signal 211 so that the positive input signal line ($out_p$) becomes the negative output signal line and the negative input signal line ($out_n$) becomes the positive output signal line. This causes the differential signal 213 to be an inverted version of the differential signal 211 that is received by the inversion circuitry 212. It is noted that single-ended signals could also be utilized, if desired, and that the inversion control signal (INV) 222 could be adjusted such that a low logic level indicates assertion of this signal and causes an inversion. Further modifications could also be made if desired.

Looking to additional circuitry shown in FIG. 2B, it is noted that an output driver 214 can be used, if desired. Output driver 214 receives the divider output signal 213 from the inversion circuitry 212 and receives the output control signal 224. As depicted, the output control signal (OUT CTRL) 224 is a multi-bit control signal that determines the output for the output driver 214, which can be any of a variety of output signals ($out_1 \ldots out_N$) 216. For example, these output signals ($out_1 \ldots out_N$) 216 can be implemented as different output drive strengths that are selected by the output control signal (OUT CTRL) 224 in order to drive different receiving blocks (e.g., mixer circuitry, divider circuitry, integrated circuit pads, etc.), as desired.

It is further noted that to further improve performance, the first divider cell 206A can be implemented with TSPC (true single-phase clocking) circuitry, such that it is dynamic circuitry. And the second divider cell 206B can be implemented using CMOS (complimentary metal oxide semiconductor) circuitry, such that it is static circuitry. It is noted that TSPC logic features higher maximum frequency of operation but also has higher minimum frequency of operation. Conversely, CMOS logic can operate at frequencies as low as DC but, as compared to TSPC logic, features a lower maximum frequency of operation. Therefore, TSPC logic can be used in the first stage where maximum speed of operation is desirable, and CMOS logic can be used in the second stage to lower the minimum frequency of operation. Overall, this combination of TSPC logic and CMOS logic advantageously provides a wide input frequency range.

Figure 2C:
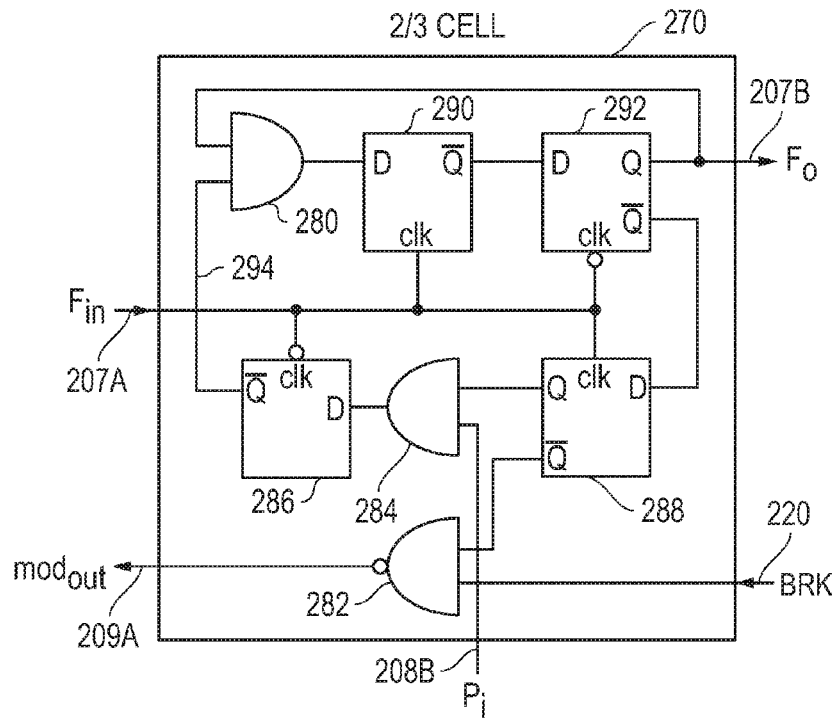
FIG. 2C is a circuit diagram for divider cell circuitry that can be used for the second divider cell in FIG. 2B.

FIG. 2C is a circuit diagram of an embodiment 270 for programmable divider cell circuitry (DIV 2/3) that can be used for the second divider cell 206B in FIG. 2B. It is noted that the first divider cell 206A in FIG. 2B can be implemented using the circuitry shown in FIG. 1B, except that the output signal line 182 for the modulus output signal ($mod_{OUT}$) can be removed, as it is not used with respect to the first divider cell in the plurality of cascaded divider cells. The second divider cell 206B can be implemented using similar to circuitry to that shown for divider cell 150 of FIG. 1B (Prior Art) with modifications to account for the adjustment signal (BRK) 220. The embodiment 270 provides example circuitry for the second divider cell 206B.

As depicted in FIG. 2C, divider cell circuitry 270 receives the output signal 207A from the first divider cell 206A as its input signal ($F_{IN}$). Divider cell circuitry 270 also outputs the divided frequency signal 207B as its output signal ($F_O$). Because the input modulus signal ($mod_{IN}$) 209B is set to logic "1" in FIG. 2B, it can be implemented with a modification as compared to FIG. 1B (Prior Art) so that the D-input for D flip-flop 288 directly receives the inverted output (Q_bar) signal for D flip-flop 292 (i.e., an extra AND gate is not used, such as AND gate 192 in FIG. 1B (Prior Art)). Divider cell circuitry 270 also generates an output modulus signal ($mod_{OUT}$) 209A. Further, the divider cell circuitry 270 receives the adjustment signal (BRK) 220 that causes this output modulus signal ($mod_{OUT}$) 209A to always be a logic high level when the adjustment signal (BRK) 220 is asserted (e.g., logic low level).

Looking in more detail to FIG. 2C, divider cell circuitry 270 includes AND gates 280 and 284, NAND gate 282, and D flip-flop latches 286, 288, 290 and 292. The AND gate 280 receives the output (Q) signal 207B from D flip-flop latch 292 and receives the divider selection signal (2/3) 294. The D flip-flop latch 290 receives the output of AND gate 280 as its data (D) input and receives the input signal 207A as its clock (CLK) input. The inverted output (Q_bar) of the D flip-flop latch 290 is received as the data (D) input for the D flip-flop latch 292. The D flip-flop latch 292 also receives an inverted version of the input signal 207A as its clock (CLK) input. The output (Q) of D flip-flop latch 292 is provided as the output signal ($F_O$) 207B.

The inverted output (Q_bar) of D flip-flop latch 292 is received as the data (D) input for D flip-flop latch 288. The D flip-flop latch 288 also receives the input signal 207A as its clock (CLK) input. The output signal (Q) from D flip-flop latch 288 is received as an input to AND gate 284 along with the programming input signal ($p_1$) 208B. The output of AND gate 284 is provided as the data (D) input for D flip-flop latch 286. D flip-flop latch 286 also receives an inverted version of the input signal 207A as its clock (CLK) input. The inverted output signal (Q_bar) from D flip-flop latch 286 provides the divider selection signal (2/3) 294.

In contrast to FIG. 1B (Prior Art), the modulus output signal ($mod_{OUT}$) 209A is provided as an output of NAND gate 282. NAND gate 282 receives the inverted output (Q_bar) signal from D flip-flop latch 288 and the adjustment signal (BRK) 220. As such, for the embodiment 270 depicted, when the adjustment signal (BRK) 220 is asserted as a low logic level "0," the modulus output signal ($mod_{OUT}$) 276 is always forced to a high logic level "1" so that the first divider cell circuitry 206A always divides by three, as described above. When the adjustment signal (BRK) 220 is not asserted (e.g., high logic level), the output of NAND gate 282 will be dependent upon the state of the inverted output (Q_bar) signal from D flip-flop latch 288.

Figure 2D:
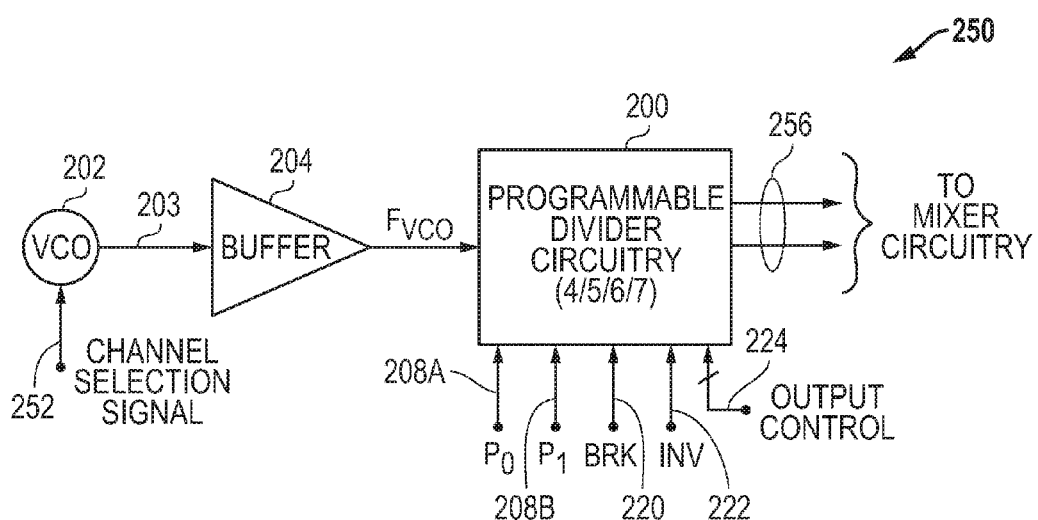
FIG. 2D is a block diagram for a system that utilizes the programmable divider circuitry of FIG. 2B to generate mixing signals for radio frequency (RF) mixing circuitry.

FIG. 2D is a block diagram for an embodiment 250 that utilizes divider circuitry 200 to generate mixing signals 256 for radio frequency (RF) receivers, such as RF receivers used for receiving television broadcast channels through satellite or cable transmissions. For the embodiment depicted, a voltage controlled oscillator (VCO) 202 receives a channel selection signal 252 and outputs an oscillation signal 203 to buffer circuitry 204. The buffer circuitry 204 then outputs an input signal ($F_{VCO}$) to the programmable divider circuitry 200. As described herein, the programmable divider circuitry 200 provides a divide-by-4, divide-by-5, divide-by-6 or a divide-by-7 operation depending upon the programmable input control signals ($p_0$, $p_1$) 208A and 208B. Further, as described herein, for a divide-by-6, the adjustment control signal (BRK) 220 is used to adjust the duty cycle of the resulting output signal by adjusting the operation of the circuitry within the divider cells. As further described herein, for a divide-by-7, the inversion control signal (INV) 222 is used to adjust the duty cycle of the resulting signal. The output control signal 224 is multi-bit signal used to determine the output 256 for the programmable divider circuitry 200. This output 256 can be, for example, a differential signal provided to mixer circuitry for RF receivers, if desired.

In operation of the system 250, as the oscillation signal 203 is adjusted by the channel selection signal 252, the divider output signal 256 will also be adjusted, thereby providing different mixing signals to the mixer circuitry to allow for different channels to be down converted to a desired intermediate frequency (IF). It is noted that channel selection signal 252, the programmable input control signals ($p_0$, $p_1$) 208A and 208B, the divide-by-6 adjustment control signal (BRK) 220, the inversion control signal (INV) 222, and the output control signals 224 can all be generated and controlled by control circuitry associated with the device or system within which the embodiment 250 is being used.

The operation of the programmable divider circuitry 200 in FIG. 2B will now be further described in more detail with respect to the timing diagrams for divide-by-4, divide-by-5, divide-by-6 and divide-by-7 operation as shown in FIGS. 3A-3D.

Figure 3A:
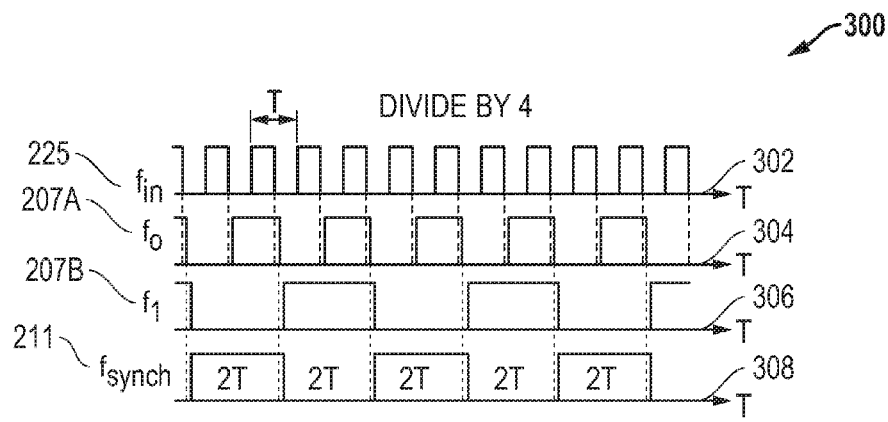
FIGS. 3A-D are a timing diagrams for a divide-by-four, divide-by-five, divide-by-six and divide-by-seven operation of the programmable divider circuitry of FIG. 2B.

FIG. 3A is a timing diagram 300 for the divider circuitry 200 where a divide-by-4 has been selected ($p_1p_0$=00). The timeline 302 represents the cycles of the input clock signal ($F_{IN}$) 225 with the time period "T" representing a clock period for this input clock signal ($F_{IN}$) 225. Timeline 304 represents the cycles of the output signal ($f_0$) 207A generated by the first divider cell 206A. As $p_0$=0, this first divider cell 206A provides a divide-by-2, staying low for one clock period T and staying high for one clock period T in each cycle (2T) for the output signal ($f_0$) 207A. Timeline 306 represents the cycles of the output signal ($f_1$) 207B from the second divider cell 206B. As $p_1$=0, this second divider cell 206B provides a divide-by-2, staying low for one clock period (2T) of the output signal ($f_0$) 207A and staying high for one clock period (2T) the output signal ($f_0$) 207A in each cycle (4T) for the output signal ($f_1$) 207B. Timeline 308 represents the output signal ($f_{SYNCH}$) 211 from the synchronization circuitry 210 that has been sampled with the falling edges of the output signal ($f_0$) 207A. The output signal ($f_{SYNCH}$) 211, therefore, is high for two time periods (2T) and low for two time periods (2T) in each cycle, thereby achieving a duty cycle of about 50%.

Figure 3B:
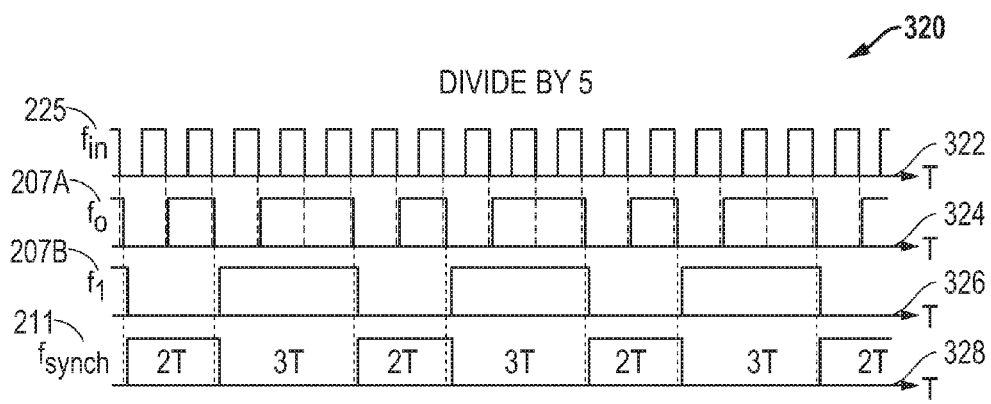

FIG. 3B is a timing diagram 320 for the divider circuitry 200 where a divide-by-5 has been selected ($p_1p_0$=01). The timeline 322 represents the cycles of the input clock signal ($F_{IN}$) 225 with the time period "T" representing a clock period for this input clock signal ($F_{IN}$) 225. Timeline 324 represents the cycles of the output signal ($f_0$) 207A generated by the first divider cell 206A. As $p_0$=1 and the modulus input ($mod_{IN}$) for the first divider cell 206A is connected to the modulus output ($mod_{OUT}$) for second divider cell 206B, this first divider cell 206A provides an alternating divide-by-2 and divide-by-3. For the first two clock cycles (2T) of the input clock signal ($F_{IN}$), the output signal ($f_0$) 207A stays low for one period T and stays high for one clock period T in each cycle (2T). For the next three clock cycles (3T) of the input clock signal ($F_{IN}$), the output signal ($f_0$) 207A stays low for one clock period T and stays high for two clock periods 2T in each cycle (3T). Thus, for each five cycles (5T) for the input clock signal ($F_{IN}$), the output signal ($f_0$) 207A repeats a 1T-low/1T-high/1T-low/2T-high pattern. Timeline 326 represents the cycles of the output signal ($f_1$) 207B from the second divider cell 206B. As $p_1$=0, this second divider cell 206B provides a divide-by-2, transitioning on each falling edge of the output signal ($f_0$) 207A. As such, the output signal ($f_1$) 207B stays low for two time periods (2T) and stays high for three time periods (3T) in each cycle (5T) of the output signal ($f_1$) 207B. Timeline 328 represents the output signal ($f_{SYNCH}$) 211 from the synchronization circuitry 210 that has been sampled with the falling edges of the output signal ($f_0$) 207A. The output signal ($f_{SYNCH}$) 211, therefore, is high for two time periods (2T) and low for three time periods (3T) in each cycle, thereby achieving a duty cycle of about 40%.

Figure 3C:
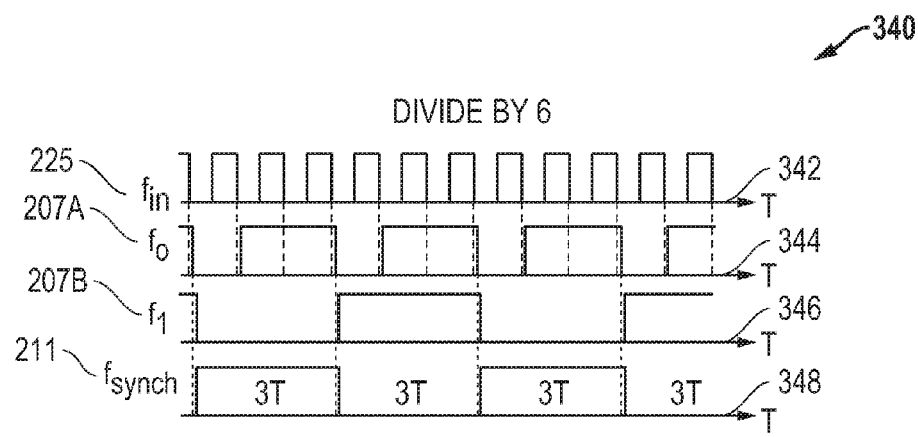

FIG. 3C is a timing diagram 340 for the divider circuitry 200 where a divide-by-6 has been selected ($p_1p_0$=01, BRK asserted). The timeline 342 represents the cycles of the input clock signal ($F_{IN}$) 225 with the time period "T" representing a clock period for this input clock signal ($F_{IN}$) 225. Timeline 344 represents the cycles of the output signal ($f_0$) 207A generated by the first divider cell 206A. As $p_0$=1 and the BRK control signal is asserted, this first divider cell 206A provides a divide-by-3, staying low for one clock period T and staying high for two clock periods 2T in each cycle (3T) for the output signal ($f_0$) 207A. Timeline 346 represents the cycles of the output signal ($f_1$) 207B from the second divider cell 206B. As $p_1=0$, this second divider cell 206B provides a divide-by-2, staying low for one clock period (3T) of the output signal ($f_0$) 207A and staying high for one clock period (3T) the output signal ($f_0$) 207A in each cycle (6T) for the output signal ($f_1$) 207B. Timeline 308 represents the output signal ($f_{SYNCH}$) 211 from the synchronization circuitry 210 that has been sampled with the falling edges of the output signal ($f_0$) 207A. The output signal ($f_{SYNCH}$) 211, therefore, is high for three time periods (3T) and low for three time periods (3T) in each cycle, thereby achieving a duty cycle of about 50%.

Figure 3D:
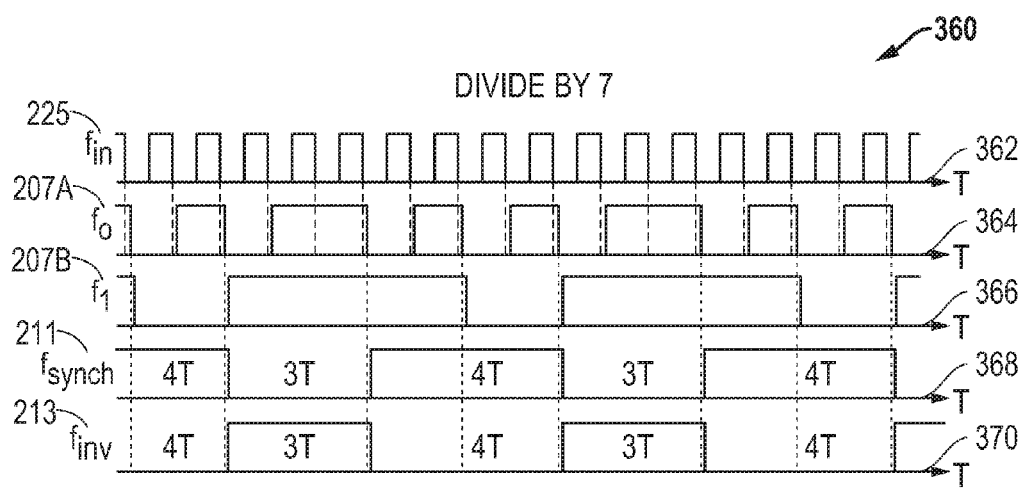

FIG. 3D is a timing diagram 360 for the divider circuitry 200 where a divide-by-7 has been selected ($p_1p_0=11$, INV asserted). The timeline 362 represents the cycles of the input clock signal ($F_{IN}$) 225 with the time period "T" representing a clock period for this input clock signal ($F_{IN}$) 225. Timeline 364 represents the cycles of the output signal ($f_0$) 207A generated by the first divider cell 206A. As $p_0=1$ and the modulus input ($mod_{IN}$) for the first divider cell 206A is connected to the modulus output ($mod_{OUT}$) for second divider cell 206B, this first divider cell 206A provides an alternating divide-by-2 and divide-by-3. For the first two clock cycles (2T) of the input clock signal ($F_{IN}$), the output signal ($f_0$) 207A stays low for one clock period T and stays high for one clock period T in each cycle (2T). For the next three clock cycles (3T) of the input clock signal ($F_{IN}$), the output signal ($f_0$) 207A stays low for one clock period T and stays high for two clock periods 2T in each cycle (3T). Thus, for each five cycles (5T) for the input clock signal ($F_{IN}$), the output signal ($f_0$) 207A repeats a 1T-low/1T-high/1T-low/2T-high pattern. Timeline 366 represents the cycles of the output signal ($f_1$) 207B from the second divider cell 206B. As $p_1=1$, this second divider cell 206B provides a divide-by-3, staying low for the first clock period (2T) of the output signal ($f_0$) 207A and staying high for next two clock periods (5T) of the output signal ($f_0$) 207A. Thus, for each seven cycles (7T) for the input clock signal ($F_{IN}$), the output signal ($f_1$) 207B repeats a 2T-low/5T-high pattern. The timeline 368 represents the output signal ($f_{SYNCH}$) 211 from the synchronization circuitry 210 that has been sampled with the falling edges of the output signal ($f_0$) 207A. After reaching a steady state, the output signal ($f_{SYNCH}$) 211 is high for four time periods (4T) and low for three time periods (3T) in each cycle, thereby achieving a duty cycle of about 57%.

For this divide-by-7 selection, it is further noted that the inversion control signal (INV) 222 is asserted so that the inversion circuitry 212 inverts the output signal ($f_{SYNCH}$) 211. Timeline 370 represents the cycles of the output signal ($f_{INV}$) 213 from inversion circuitry 212, which is an inverted version of the output signal ($f_{SYNCH}$) 211. Thus, the output signal ($f_{INV}$) 213 is low for four time periods (4T) and high for three time periods (3T) in each cycle, thereby achieving a duty cycle of about 43%.

Advantageously, the duty cycles achieved are 50%, 40%, 50% and 43% respectively for the divide-by-4, divide-by-5, divide-by-6 and divide-by-7 circumstances.

It is noted that a logic high or "1" is assumed for some signals to indicate an active or asserted state for the embodiments described. However, if desired, a logic low or "0" could be used to indicate an active or asserted state. Similarly, it is noted that a logic low or "0" is assumed for some signals to indicate an active or asserted state for the embodiments described. However, if desired, a logic high or "1" could be used to indicate an active or asserted state. Circuitry can be modified accordingly if changes in polarity of active/asserted states is desired.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures. For example, equivalent elements may be substituted for those illustrated and described herein, and certain features of the invention may be utilized independently of the use of other features, all as would be apparent to one skilled in the art after having the benefit of this description of the invention.

What is claimed is:

1. Programmable divider circuitry, comprising:
a first and a second cascaded divider cells configured to receive a divider input signal, to receive programming input signals to select an integer division ratio, to apply the selected division ratio to the divider input signal, and to generate a divider output signal based upon the selected division ratio and the divider input signal, the selectable integer division ratio being 4, 5, 6 or 7; and
synchronization circuitry coupled to receive the divider output signal and configured to use a signal generated by the first cascaded divider cell as a synchronization signal to sample the divider output signal and to produce a synchronized divider output signal.

2. The programmable circuitry of claim 1, wherein each divider cell is configured to operate in a divide-by-two mode or in a divide-by-three mode.

3. The programmable divider circuitry of claim 2, wherein the first divider cell is configured to receive the divider input signal, to receive a modulus input signal from the second divider cell, to receive a programming input signal, and to generate an output signal; and wherein the second divider cell is configured to receive the output signal from the first divider cell as its input signal, to receive a fixed modulus input signal, to receive a programming input signal, to generate the divider output signal, and to generate the modulus input signal for the first divider cell.

4. The programmable divider circuitry of claim 3, wherein the synchronization circuitry is configured to use the output signal from the first divider cell as the synchronization signal.

5. The programmable divider circuitry of claim 4, wherein when a division ratio of 6 is selected, the first divider cell is reconfigured to receive a fixed signal as its modulus input signal and configured to operate in a divide-by-three mode, and the second divider cell is configured to operate in a divide-by-two mode.

6. The programmable divider circuitry of claim 4, further comprising programmable inversion circuitry coupled to receive the synchronized divider output signal and configured to invert the synchronized divider output signal when a division ratio of 7 is selected for the plurality of cascaded divider cells.

7. The programmable divider circuitry of claim 4, wherein the first divider cell comprises TSPC (true single-phase clocking) circuitry and the second divider cell comprises CMOS circuitry.

8. A system including programmable divider circuitry, comprising:
a controlled oscillator configured to generate an oscillator output signal having a frequency dependent upon a control signal;
programmable divider circuitry coupled to the controlled oscillator, comprising:

a first and a second cascaded divider cells configured to receive the oscillator output signal as a divider input signal, to receive programming input signals to select an integer division ratio, to apply the selected division ratio to the divider input signal, and to generate a divider output signal based upon the selected division ratio and the divider input signal, the integer division ratio being 4, 5, 6 or 7; and synchronization circuitry coupled to receive the divider output signal and configured to use a signal generated by the first cascaded divider cell as a synchronization signal to sample the divider output signal and to produce a synchronized divider output signal.

9. The system of claim 8, wherein the control signal comprises a channel selection signal.

10. The system of claim 8, wherein the first divider cell is configured to receive the divider input signal, to receive a modulus input signal from the second divider cell, to receive a programming input signal, and to generate an output signal; and wherein the second divider cell is configured to receive the output signal from the first divider cell as its input signal, to receive a fixed modulus input signal, to receive a programming input signal, to generate the divider output signal, and to generate the modulus input signal for the first divider cell.

11. The system of claim 10, wherein the synchronization circuitry is configured to use the output signal from the first divider cell as the synchronization signal.

12. The system of claim 11, wherein when a division ratio of 6 is selected, the first divider cell is reconfigured to receive a fixed signal as its modulus input signal and configured to operate in a divide-by-three mode, and the second divider cell is configured to operate in a divide-by-two mode; and further comprising programmable inversion circuitry coupled to receive the synchronized divider output signal and configured to invert the synchronized divider output signal when a division ratio of 7 is selected for the plurality of cascaded divider cells.

13. The system of claim 12, further comprising mixer circuitry configured to receive an output signal from the programmable inversion circuitry.

14. A method for generating divided output signals with programmable division ratios, comprising:

receiving a divider input signal with divider circuitry including a first and a second cascaded divider cells;

receiving programming input signals to select an integer division ratio of 4, 5, 6 or 7 for the divider circuitry;

generating a divider output signal representing a divided version of the input signal based upon the programming input signals; and utilizing a signal generated by the first cascaded divider cell to sample the divider output signal and to produce synchronized divider output signals.

15. The method of claim 14, further comprising operating each divider cell in a divide-by-two mode or in a divide-by-three mode.

16. The method of claim 15, wherein the first divider cell is configured to receive the divider input signal, to receive a modulus input signal from the second divider cell, to receive a programming input signal, and to generate an output signal; and wherein the second divider cell is configured to receive the output signal from the first divider cell as its input signal, to receive a fixed modulus input signal, to receive a programming input signal, to generate the divider output signal, and to generate the modulus input signal for the first divider cell.

17. The method of claim 16, wherein the utilizing step comprises utilizing the output signal from the first divider cell as the synchronization signal.

18. The method of claim 17, further comprising when a division ratio of 6 is selected for the plurality of cascaded divider cells, reconfiguring the first divider cell to receive a fixed modulus input signal, operating the first divider cell in a divide-by-three mode, and operating the second divider cell in a divide-by-two mode.

19. The method of claim 17, further comprising inverting the synchronized divider output signal when a division ratio of 7 is selected for the plurality of cascaded divider cells.

20. The method claim 17, further comprising receiving the divider input signal from a controlled oscillator and utilizing the synchronized divider output signal to provide an input signal to mixer circuitry.

* * * * *